United States Patent [19]
Burch et al.

[11] Patent Number: 5,901,062
[45] Date of Patent: May 4, 1999

[54] SEMICONDUCTOR STRUCTURE DESIGN AND PROCESS VISUALIZATION THROUGH THE USE OF SIMPLE PROCESS MODELS AND INTUITIVE INTERFACES

[75] Inventors: Richard Gene Burch, McKinney; Purnendu Kanti Mozumder, Plano, both of Tex.

[73] Assignee: Texas Instruments Incorporated, Dallas, Tex.

[21] Appl. No.: 08/719,056

[22] Filed: Sep. 24, 1996

Related U.S. Application Data

[60] Provisional application No. 60/004,223, Sep. 25, 1995.
[51] Int. Cl.$^6$ .............................. G06F 17/50; G06F 19/00
[52] U.S. Cl. .................... 364/488; 364/578; 364/468.04; 345/334; 345/340; 345/352; 345/420
[58] Field of Search ..................................... 364/488–491, 364/578, 468.02, 468.04, 468.28; 345/419–427, 333–334, 339, 340, 352

[56] References Cited

U.S. PATENT DOCUMENTS

| | | | |
|---|---|---|---|
| 5,546,312 | 8/1996 | Mozumder et al. ................ | 364/468.03 |
| 5,644,688 | 7/1997 | Leon et al. .............................. | 395/120 |

OTHER PUBLICATIONS

Durbeck et al.("A System for semiconductor process specification", IEEE Transactions on Semiconductor Manufacturing, vol. 6, No. 4, pp. 297–305, Nov. 1993).

Gopalarao et al. ("An Integrated Technology CAD system for process and device designers", IEEE Transactions on Very Large Scale Integration [VLSI] Systems, vol. 1, No. 4, pp. 482–490, Dec. 1993).

Giles et al. ("Semiconductor wafer representation for TCAD", IEEE Transactions on Computer–Aided Design of Integrated Circuits and Systems, vol. 13, No.1, pp. 82–95, Jan. 1994).

*Primary Examiner*—Kevin J. Teska
*Assistant Examiner*—Phallaka Kik
*Attorney, Agent, or Firm*—Jacqueline J. Garner; W. James Brady, III; Richard L. Donaldson

[57] ABSTRACT

A semiconductor structure design and process visualization tool (10). A main menu (30) allows a user to add, edit or delete process steps (16a–f) to create a process flow in process flow window (12). Main menu (30) provides a set of process models to be selected from. The set of process models are simple first-order geometric models that require only physical parameters of a resulting device layer. Specific process conditions are not required. Semiconductor process and wafer representation tool applies the physical parameters to the corresponding process model to quickly create a cross-section (20) in cross-section window (22) corresponding to a selected process step (16d) in process flow window (12).

15 Claims, 12 Drawing Sheets

SEMICONDUCTOR STRUCTURE DESIGN AND PROCESS VISUALIZATION THROUGH THE USE OF SIMPLE PROCESS MODELS AND INTUITIVE INTERFACES

This application claims priority under 35 USC § 119 (e) (1) of provisional application Ser. No. 60/004,223, filed Sep. 25, 1995.

FIELD OF THE INVENTION

This invention generally relates to semiconductor processing and more specifically to semiconductor structure design and process visualization.

BACKGROUND OF THE INVENTION

Visualizing semiconductor structures and processes is a crucial, time-consuming element of successful structure design and process integration. Usually, semiconductor structures are visualized as one or more two dimensional cross-sections of the wafer during various stages of processing. Traditionally, these cross-section were constructed at specific points in the process flow. However, prior art methods of constructing these cross-sections are cumbersome and difficult. Existing methods can be divided into two categories: manual methods and process simulation. Manual methods utilize either hand-drafting tools to create the cross-sections or general computer drawing programs. These methods are very tedious and time-consuming. Any change in structure or process requires lengthy recreations of cross-sections. These approaches have the maximum flexibility, since the engineer can incorporate any phenomena and experimental results with which he is familiar. For example, SEMs of actual isolation structures are often used to accurately create the profiles for LOCOS steps.

On the other extreme, process simulation methods require a detailed description of the process. This detailed description is provided to a process simulator that uses complex models in an attempt to create accurate cross-sections. While process simulators are very important during process development, they have several disadvantages for visualization of semiconductor structure and processes. First, the two dimensional versions that are required for visualization are quite time-consuming to run. Second, since they strive for accuracy, they normally require detailed information about the process before they can be used for simulation. During the initial design phases, where visualization is extremely important, the designer may not have the detailed information needed. Third, typical simulators attempt to accurately predict all steps in the cross-section. This requires extremely complicated models that are not needed for the majority of steps. While software integration attempts have been made to simplify the input requirements on the engineer, these basic disadvantages remain true for simulation based visualization methods.

SUMMARY OF THE INVENTION

A method of visualizing semiconductor structure designs and processes is disclosed herein. Simple abstract models, such as conformal deposition, planarizing deposition, anisotropic etch and isotropic etch, are used in place of a large number of specific process steps. For example, conformal deposition may be used for a variety of deposition techniques such as CVD, PECVD, or LPCVD. The models require user input of physical parameters of the resulting device layer rather than specific process conditions needed to form the structure such as process chemicals used, temperature and duration. Physical parameters may, for example, include material type, thickness, etch selectivity, or etch depth. A menu is provided to create a process flow from the simple abstract models. A process flow window is used to display the process flow and a cross-section window is provided to display the semiconductor device cross-section at a selected step in the process flow. Customization features may also be included to allow for customized process models, customizing the results of the simple abstract models, or adding text to the cross-section displayed in the cross-section window.

An advantage of the invention is providing a simpler, less time-consuming method for visualizing semiconductor device structure and process.

A further advantage of the invention is providing a method for visualizing a semiconductor design structure and process that does not require specific process conditions to be supplied.

A further advantage of the invention is providing a method for visualizing a semiconductor device and process that utilizes a unified semiconductor process and wafer representation.

These and other advantages will be apparent to those or ordinary skill in the art having reference to the specification in conjunction with the drawings.

BRIEF DESCRIPTION OF THE DRAWINGS

In the drawings.

Corresponding numerals and symbols in the different figures refer to corresponding parts unless otherwise indicated.

DETAILED DESCRIPTION OF PREFERRED EMBODIMENTS

The invention is a structure design and process visualization tool developed to ease the chores of structure design, process integration, and process visualization. It is a computer program that can be used by designers to visualize and document complex device structures and process flows. It utilizes efficient first-order models to support quick "what-if" analysis to assist the designer in checking for device structure and process integration errors. After process integration, the invention provides an efficient, intuitive tool to use for process visualization. The invention couples process flow with structure to allow easy intuitive visualization of the effects of processing on the device structure.

Figure 1:
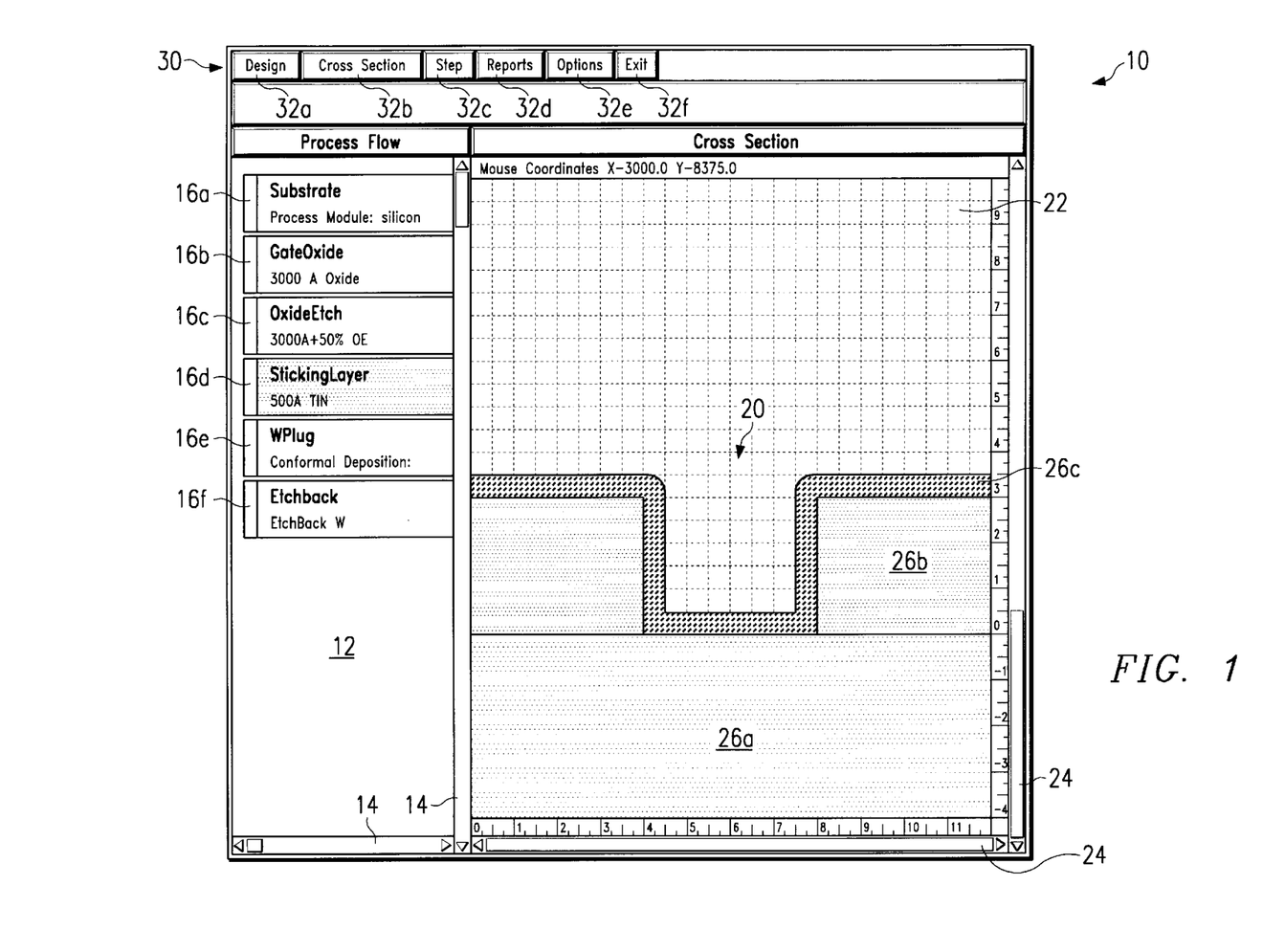
FIG. 1 is a block diagram of an interface screen for a semiconductor structure design and process visualization tool according to an embodiment of the invention.

FIG. 1 shows a structure design and process visualization tool 10 according to an embodiment of the invention. Process flow window 12 includes scroll bars 14 and a series of process steps 16a–f that represent the process flow. Process flow window 12 is interactive in that a particular step, such as step 16d, in the process flow may be selected. The selected process step 16d is highlighted. The process flow is built up by adding steps that are then inserted after the selected step 16d. Selecting a step in the process flow window 12 causes a cross-section corresponding to that step to be displayed in cross-section window 22. Selecting a step also causes whatever simulation is necessary to bring the cross-section 20 in the cross-section window 22 up to date at that step.

The cross-section window 22 contains a representation of the cross-section 20 and scroll-bars 24 to change the viewed area of the cross-section 20. The cross-section 20 that is displayed is the result of simulation and customization of the process steps up to and including the selected step 16d in the process flow window 12. As discussed above, process flow window 12 is interactive in that selecting a step in process flow window 12 causes a cross-section associated with that step to be displayed in cross-section window 22. For example, FIG. 1 shows step 16d as selected. Even though additional process steps follow step 16d, cross-section window 22 displays the cross-section 20 associated with processing up to and including step 16d but not the remaining steps. Thus, a user can pick any step in the process and view the cross-section at that point in the process.

If desired, color may by used to correlate the process steps 16a–f to the cross-section layers 26a–c. Each layer 26a–c is an editable geometry. If a given layer is selected, points making up the layer can be moved or deleted. Additionally, new points can be added to the layer. Thus, a user can customize a layer produced with the simple abstract models of the invention. If desired, a full text editor may also be provided to add text anywhere within cross-section window 22.

Main menu 30 provides mechanisms for controlling the operation of the tool 10. Main menu 30 controls the adding, editing and deleting of process steps, such as steps 16a–f. It also controls the file access and viewing area of the cross-section window 22. Menu 30 may provide access to several submenus 32a–f in order to carry out these functions. Many different organizations and customizations for sub-menus 32a–f will be apparent to those skilled in the art. One exemplary organization will now be discussed. For example, sub-menu 32a may provide file access functions such as creating a new design, opening an existing design, or saving a design. Sub-menu 32b may control aspects of cross-section window 22. Examples include zoom, print, add, move and delete points for customizing individual layers, adding and deleting text, and adding or removing the fill or colors. Sub-menu 32c may control the steps 16a–f in the process flow window 12. For example, steps may be added, edited, deleted, or copied. Sub-menu 32d may allow generation of various type of reports. Sub-menu 32e may control the dimension and grid of the cross-section window 22 and sub-menu 32f may exit the tool 10.

Figure 2:
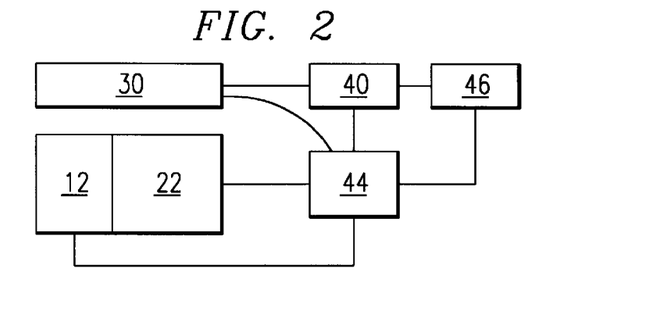
FIG. 2 is a block diagram of a the semiconductor structure design and process visualization tool of FIG. 1.

A block diagram of the semiconductor design and process visualization tool 10 is shown in FIG. 2. In order to add a process step to process flow window 12, main menu 30 retrieves a set of process models 40 for the user to select The set of process models 40 may include models for such steps as conformal deposition, planariziation deposition, selective anisotropic etch, selective isotropic etch, simple anisotropic etch, chemical-mechanical polish, oxidation, and reflow. It will be apparent to those skilled in the art that alternative or additional process models may be included. The process models in the set of process models 40 are simple first order geometric models that only require physical parameters to be input instead of specific process conditions. The physical parameters may, for example, include material type, thickness, sidewall ratio, etch selectivity, etch depth, and misalignment Table I shows a set of process models 40 and corresponding physical parameters required for each process model.

TABLE I

| Process Step | Physical Parameters |
|---|---|
| Conformal Deposition | Thickness, Sidewall ratio, Material |
| Anisotropic Etch | Etch Depth, Etch Selectivities, Mask Openings |
| Isotropic Etch | Etch Depth, Lateral Etch Ratio, Etch Selectivities, Mask Openings |
| Planarizing Deposition | Minimum Thickness, Material |
| Chemical-Mechanical Polish (CMP) | CMP Depth |
| Reflow | Material Loss |
| Process Modules | Material, Layer Geometry, Layer Surface |

In contrast to the present invention, prior art simulation methods required the user to input process conditions. Then, a host of complex semiconductor physics equations were solved to create a cross-section. In order to achieve a desired layer structure, the process conditions would then have to be modified in a trial and error type approach until the desired layer structure was achieved. This is inefficient and very time-consuming. Moreover, design engineers may not have the specific process information needed for these process simulators. The invention does not require the specific process information. The abstract models in the set of process models 40 are first-order geometric models that require only that information for which the design engineer has an intuitive feel. Because geometric models are used, the complex semiconductor physics equations are not involved. The first order models can be used to rapidly create first-order cross-sections. Thus, the invention can be used during the early phases of a structure design and process integration. In addition, possible process changes can be evaluated quickly and easily.

The set of process models 40 may include Process Modules as shown in TABLE I. Process modules are used by the designer to provide completely custom material layers that are associated with difficult to model process steps (such as LOCOS) or process steps for which no abstract model is available. A customization editor 42 may be included to create the customized process modules. Thus, a user may create a customized process module if one of the simple abstract models is not sufficient. For example, the user may import a digitized view of a layer from a SEM of an actual device or provide a geometrical algorithm for the process module. Customization editor 42 also includes graphical editing features to edit the resulting layer in cross-section window 22 of one of the simple models.

All other abstract process steps in the set of process models 40 have first-order geometric models implemented for them. The complexity of these models ranges from simple (Reflow and CMP) to very complex (Isotropic Etch). As an example of the type of geometric model implemented, a process model for conformal deposition, which is moderately complex, will now be described. A description of other process models can be found in Appendix A.

Figure 3:
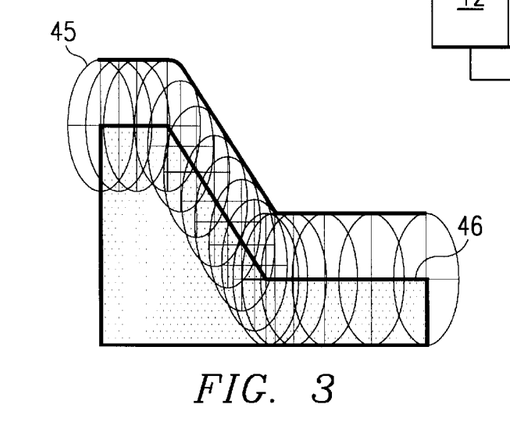
FIGS. 3–5 are cross-sectional diagrams illustrating a conformal deposition process model.
Figure 4:
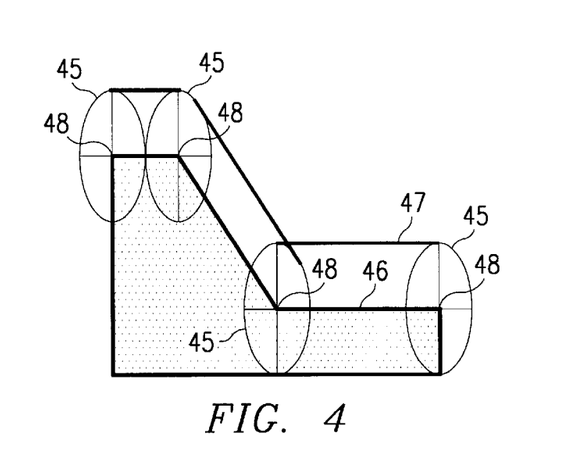
Figure 5:
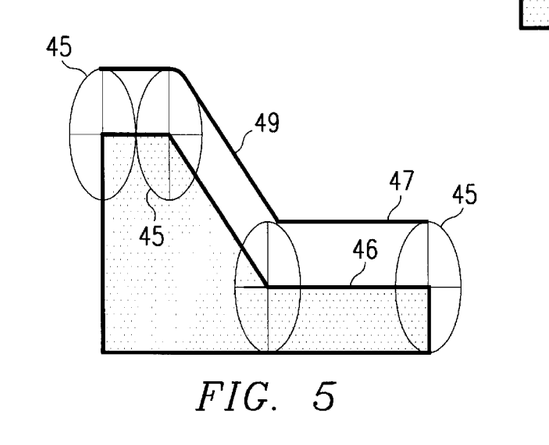

Using three physical parameters (thickness, material and sidewall ratio) supplied by the user, an ellipse 45 is created in the surface 46 of the structure upon which deposition is desired as shown in FIG. 3. Ellipse 45 has a vertical axis equal to the deposition thickness and a horizontal axis equal to the sidewall ratio times the deposition thickness. If ellipse 45 is duplicated at every point on the surface 46, then the new surface 47 of the newly deposited layer may be formed by a line segment drawn tangent to the ellipses 45. However, further analysis reveals that only a few ellipses 45 are needed to define the line segments that make up new surface 47. FIG. 4 shows that the majority of the new surface 47 can be represented using three line segments generated from four ellipses 45 centered at the four inflection points 48 of the underlying surface 46. If the angle at any surface 46 inflection point 48 is greater than 180 degrees, then line segments are necessary to approximate the curve in the surface. These can be calculated from the equations of the ellipse 45. To determine the final surface 47, a single line 49 caused by, the intersection of the generated segments can be calculated. The deposited layer is defined by the previous surface 46 and the new surface 47, as shown in FIG. 5. This method is extremely efficient; however, as with any geometric algorithm, the complexity is significantly increased by allowances for special cases and round-off errors.

Based on the physical parameters supplied, the unified semiconductor process and wafer representation (USPWR) tool 44 uses the selected process model from the set of process models 40 and adds a process step to process flow window 12 and a device layer to cross-section window 22. The USPWR tool 44 creates a cross-section for each step in process flow window 12. When a particular step in process flow window 12 is selected, the USPWR tool updates the corresponding cross-section if necessary and displays it in cross-section window 22. Updating may be necessary if a particular process model has changed, the selected step has been edited, or any preceding step has been added, edited or deleted.

An example for creating a process flow and structure cross-section using semiconductor structure and process visualization tool 10 will now be described. FIGS. 6–16 illustrate the main menu 30, process flow window 12, and cross-section window 22 or a dialog box for each step in the flow. This example uses the sub-menu organization described above.

Figure 6:
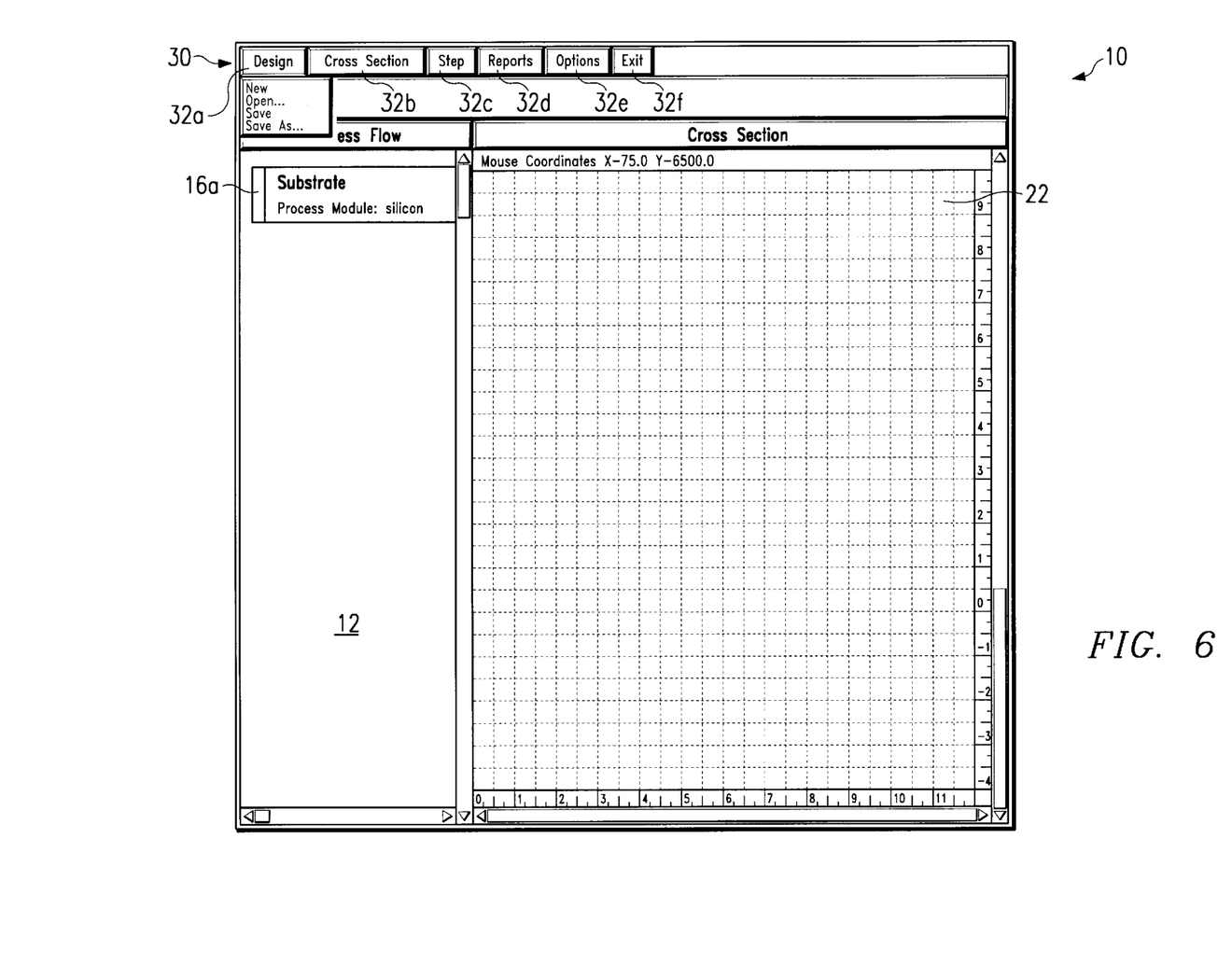
FIGS. 6–16 are block diagram of the interface screen of FIG. 1 at various operating steps.

The tool 10 is initiated and the submenu 32*a* (Design) is selected so that a new design may be selected. As shown in FIG. 6, sub-menu 32*a* (Design) offers the options of "New", "Open", "Save", and "Save As". "New" is selected to indicate that a new design is desired. The "Substrate" step 16*a* is automatically placed in process flow window 12.

Figure 7:
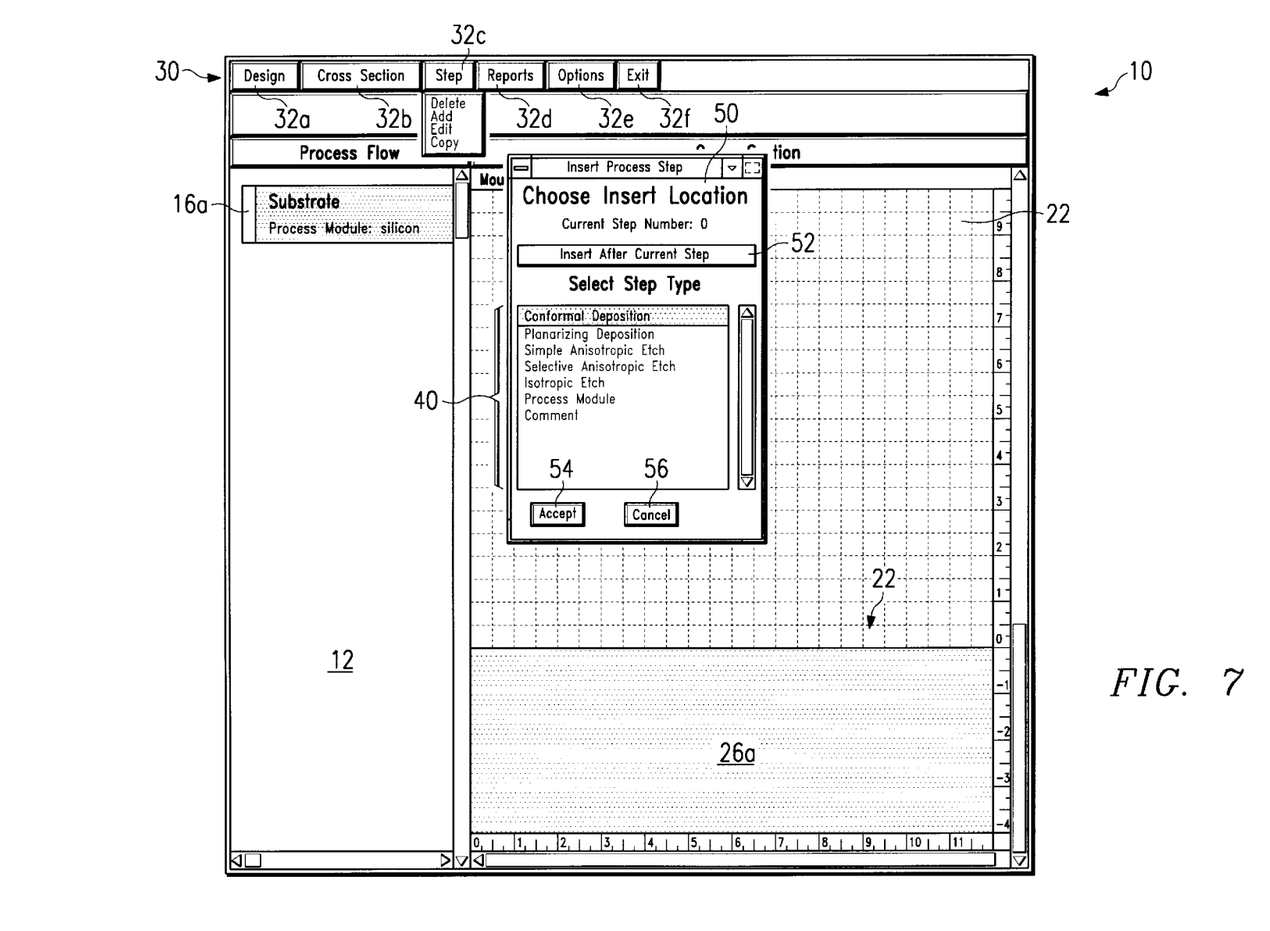

The user selects the "Substrate" step 16*a* and proceeds to add a process step. Sub-menu 32*c* (Step) is selected so that a process step may be added. As shown in FIG. 7, sub-menu 32*c* provides the options of "Delete", "Add", "Edit", and "Copy". The "Add" function is then selected by the user. Dialog box 50, "Insert Process Step" appears allowing the user to select the type of step desired. Dialog box 50 includes a set of process models 40, insert location options 52 for choosing where in the process flow the added step will be placed, and "Accept" 54 and "Cancel" 56 options. The insert location options 52 include an insert after current step option and insert before the current step option. The set of process models 40 include "Conformal Deposition", "Planarizing Deposition", "Selective Anisotropic Etch", "Isotropic Etch", "Process Module", and "Comment". "Process Module" is used to provide a custom input when none of the other models provide satisfactory results. "Comment" is used to add comments to the process flow. In this example, "Conformal Deposition" is selected and "Accept" is entered.

Figure 8:
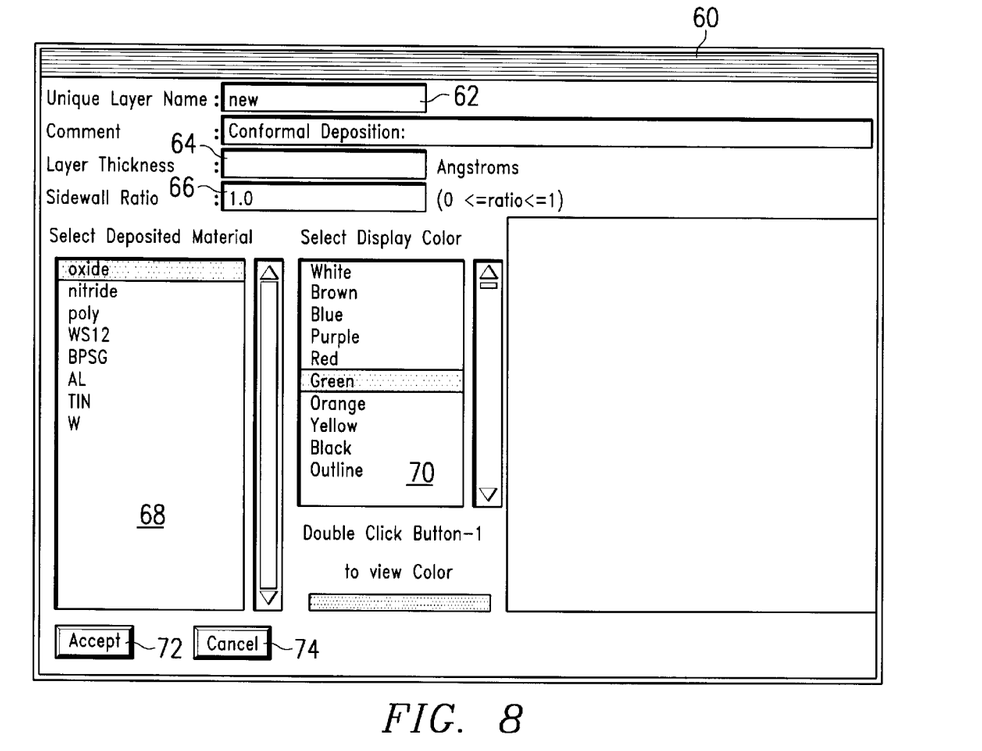
Figure 9:
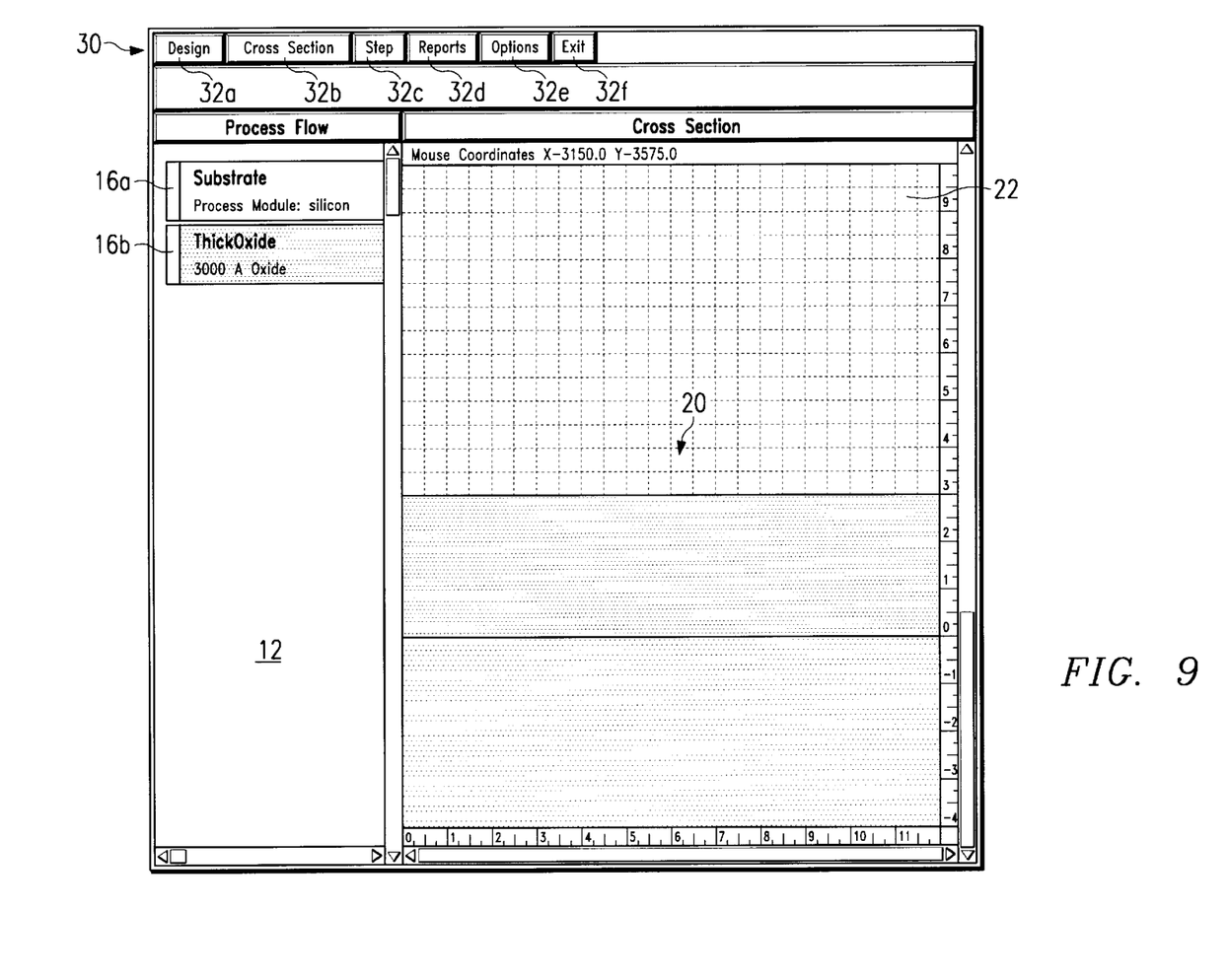

As shown in FIG. 8, an "Edit Conformal Deposition Step" dialog box 60 is displayed. Dialog box 60 includes a "Unique Layer Name" box 62 for naming each unique layer, a "Layer Thickness" box 64 to enter the desired thickness, and a "Sidewall Ratio" box 66 for entering the sidewall ratio. A list of material types is given in Select Deposited Material box 68. A list of colors is given in "Select Display Color" box 70. "Accept" 72 and "Cancel" 74 buttons are also included. In this example, a layer name of "ThickOxide" is entered with a thickness of "3000 Å" and a sidewall ratio of "1". The material type chosen is "oxide" and the "Accept" button 72 is selected. The resulting cross-section is shown in cross-section window 22 of FIG. 9. Cross-section 20 includes substrate layer 26*a* and thick oxide layer 26*b*. FIG. 9 also shows the step "ThickOxide", 16*b*, added to the process flow of process flow window 12.

Figure 10:
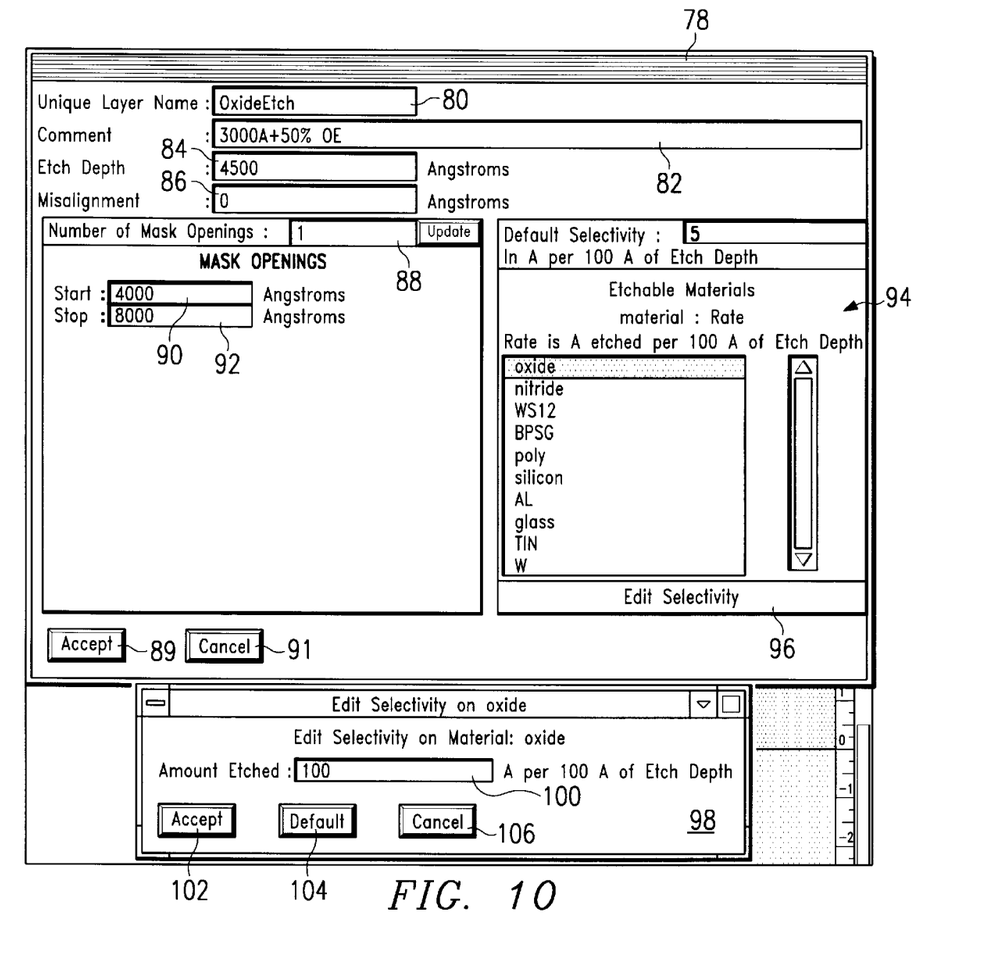

The next step to be added is a step to etch a contact hole. "Step/Add" is selected from main menu 30. "Selective Anisotropic Etch" is selected from the "Insert Process Step" dialog box 50 (shown in FIG. 7). The "Edit Selective Anisotropic Etch" dialog box 78 is displayed as shown in FIG. 10. Dialog Box 78 includes a "Unique Layer Name" box 80, a "Comment" box 82, an "Etch Depth" box 84 and a "Misalignment" box 86. There is also a box 88 for the "Number of Mask Openings" and boxes 90 and 92 to input the "Start" and "Stop" mask opening locations. "Accept" 89 and "Cancel" 91 buttons are included as well. "Etch Selectivity" window 94 allows the user to set a default selectivity as well as set a specific selectivity for a particular material type. This is accomplished with the "Edit Selectivity" button 96 which activates the "Edit Selectivity on" dialog box 98. Dialog box 98 includes an "Amount Etched" box 100 for entering the amount of a given material that is etched for 100 Å of Etch Depth. Dialog box 98 also includes "Accept" 102, "Default" 104 and "Cancel" 106 buttons.

Figure 11:
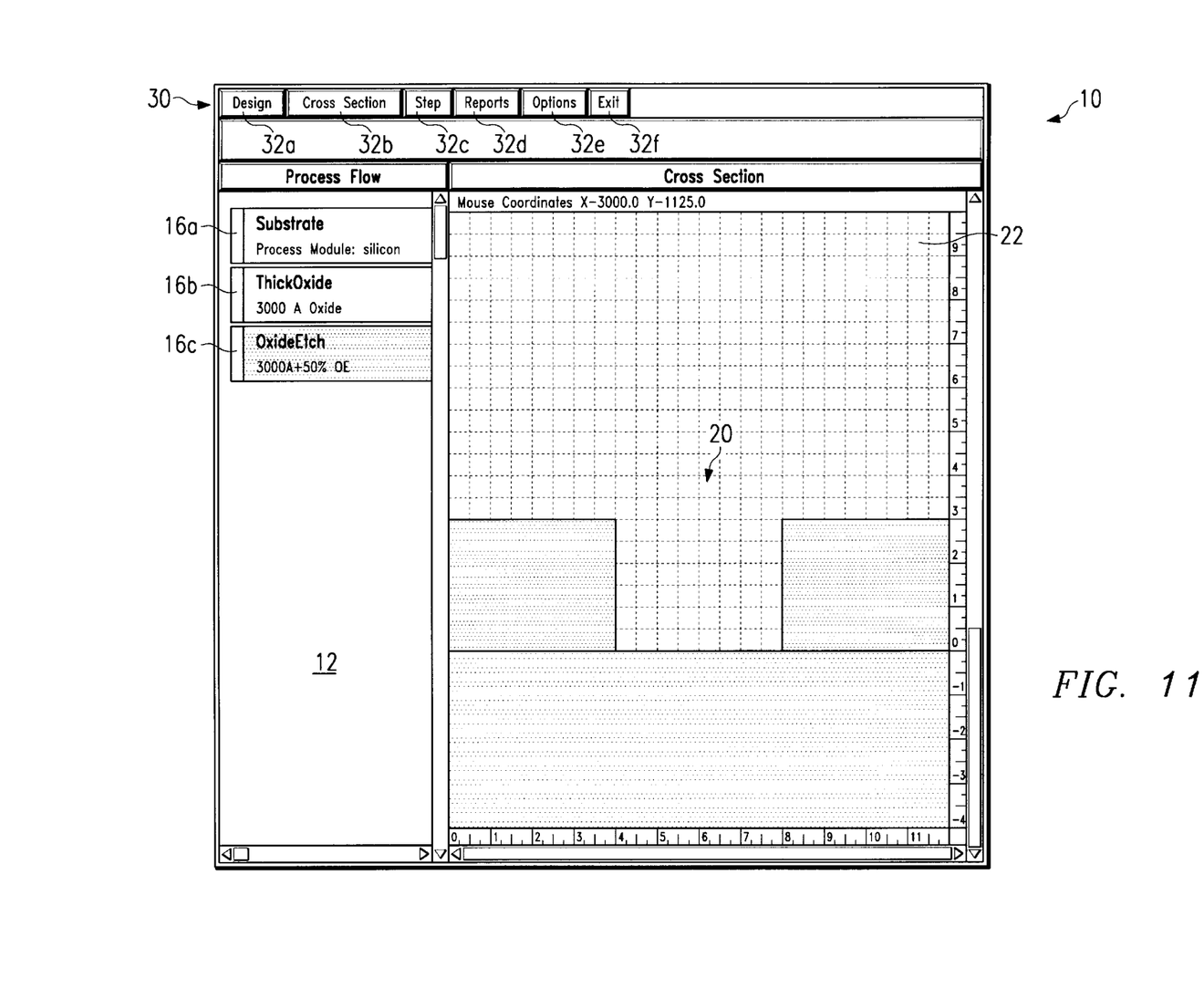

In this example, the Unique Layer Name is "OxideEtch", the Comment is "3000 Å+50% OE", the Etch Depth is "4500" Angstroms and the Misalignment is "0" Angstroms. The Number of Mask Openings is "1" and the Start is "4000" Angstroms and the Stop is "8000" Angstroms. The Default selectivity is "5" Angstroms per 100 Angstroms of Etch Depth (i.e., 20:1) and the Selectivity of oxide is edited to be "100" Angstroms per 100 Angstroms of Etch Depth (i.e., 1:1). Once Accept button 89 is entered, the Process Flow window 12 and Cross-section window 22 are updated as shown in FIG. 11.

Figure 12:
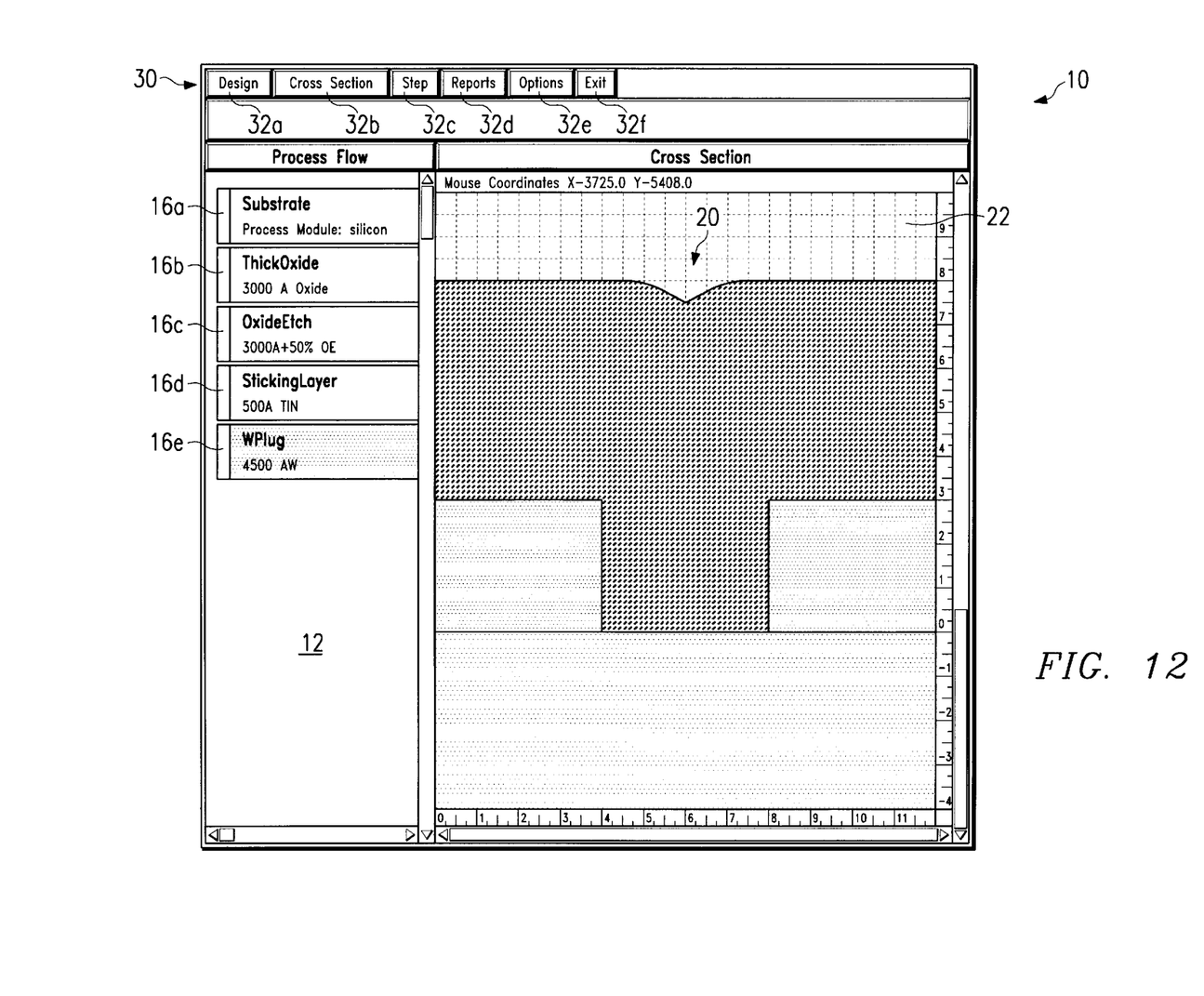

Next, a thin layer of titanium-nitride (TiN) is to be deposited. The "Step/Add" option is selected from the main menu 30 and "Conformal Deposition" is selected from the "Insert Process Step" Dialog box 50. The "Edit Conformal Deposition Step" dialog box 60 is displayed. The required physical parameters are entered in the appropriate boxes. The Unique Layer Name is "StickingLayer", the Comment is "500A TiN", the Layer Thickness is "500" angstroms and the Sidewall Ratio is 1.0. "TiN" is selected from the Select Deposition Material list. The parameters are then Accepted using button 72. The above procedure is then repeated to deposit and 4500 Å of tungsten (W). The resulting Process Flow window 12 and Cross-section windows 22 are shown in FIG. 12. Cross-section 20 includes substrate layer 26*a*, thick oxide layer 26*b*, TiN layer 26*c* and W layer 26*d*. Steps 16*c* and 16*d* are added to process flow window 12.

Figure 13:
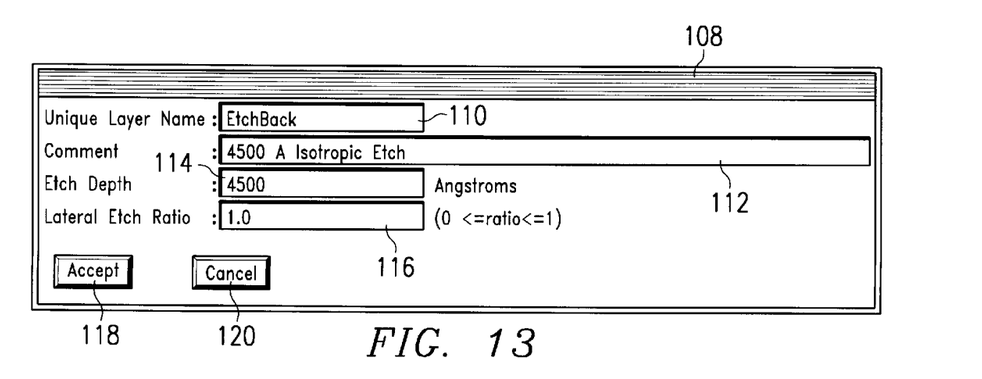

Next, it is desired to etch the W layer back. "Step/Add" is again selected from the Main menu 30 and "Isotropic Etch" is selected from the "Insert Process Step" dialog box 50. The "Edit Isotropic Etch" dialog box 108 is displayed as shown in FIG. 13. Dialog Box 108 includes the "Unique Layer Name" box 110, "Comment" box 112, "Etch depth" box 114 and "Lateral Etch Ratio" box 116. "Accept" 118 and "Cancel" 120 buttons are again included. In this example, the Unique Layer Name is "Etchback", the Comment is "4500A Isotropic Etch" the Etch Depth is "4500" Angstroms and the Lateral Etch Ratio is "1.0". After the parameters are accepted, the Process Flow window 12 and Cross-section window 22 are updated as shown in FIG. 14.

Figure 14:
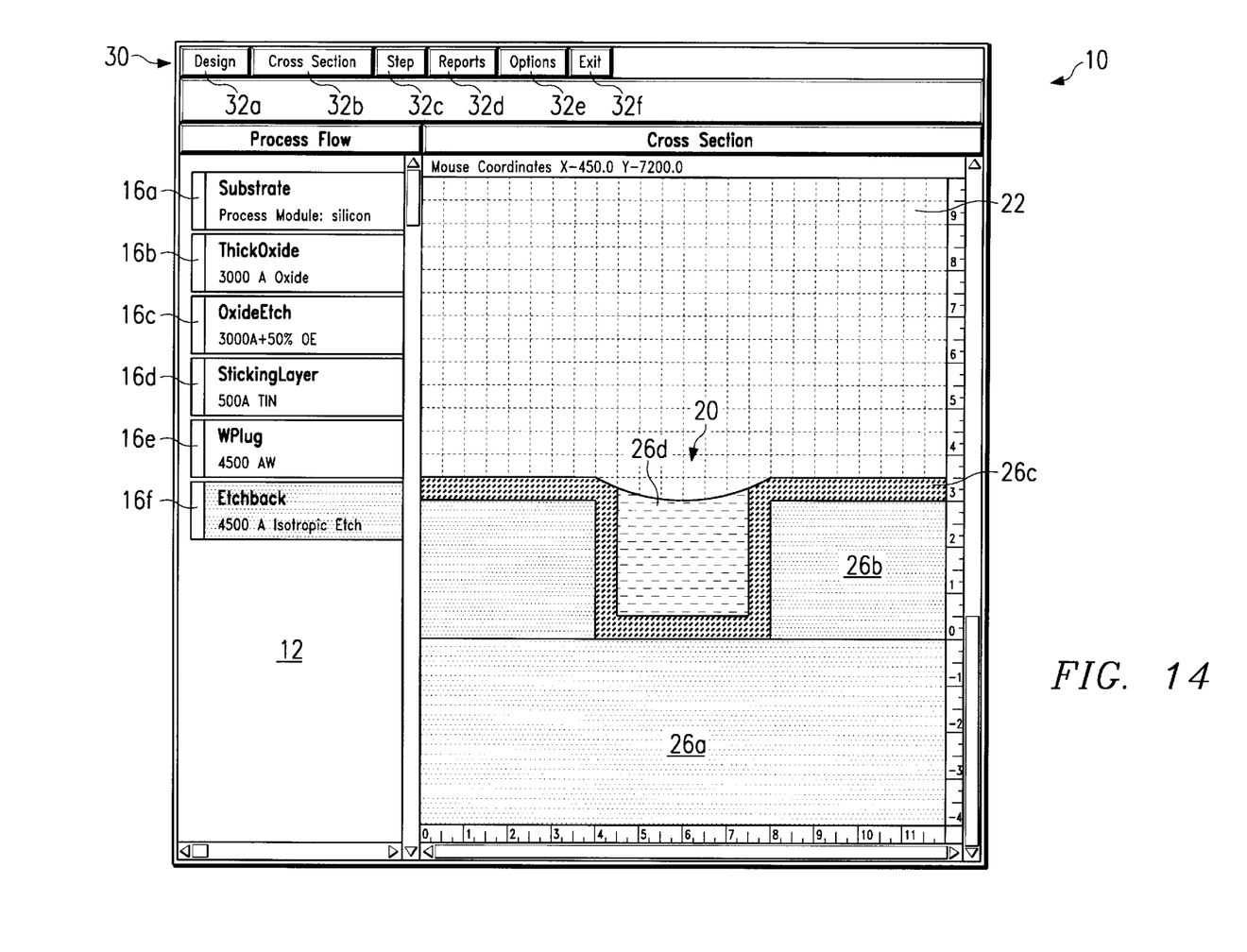
Figure 15:
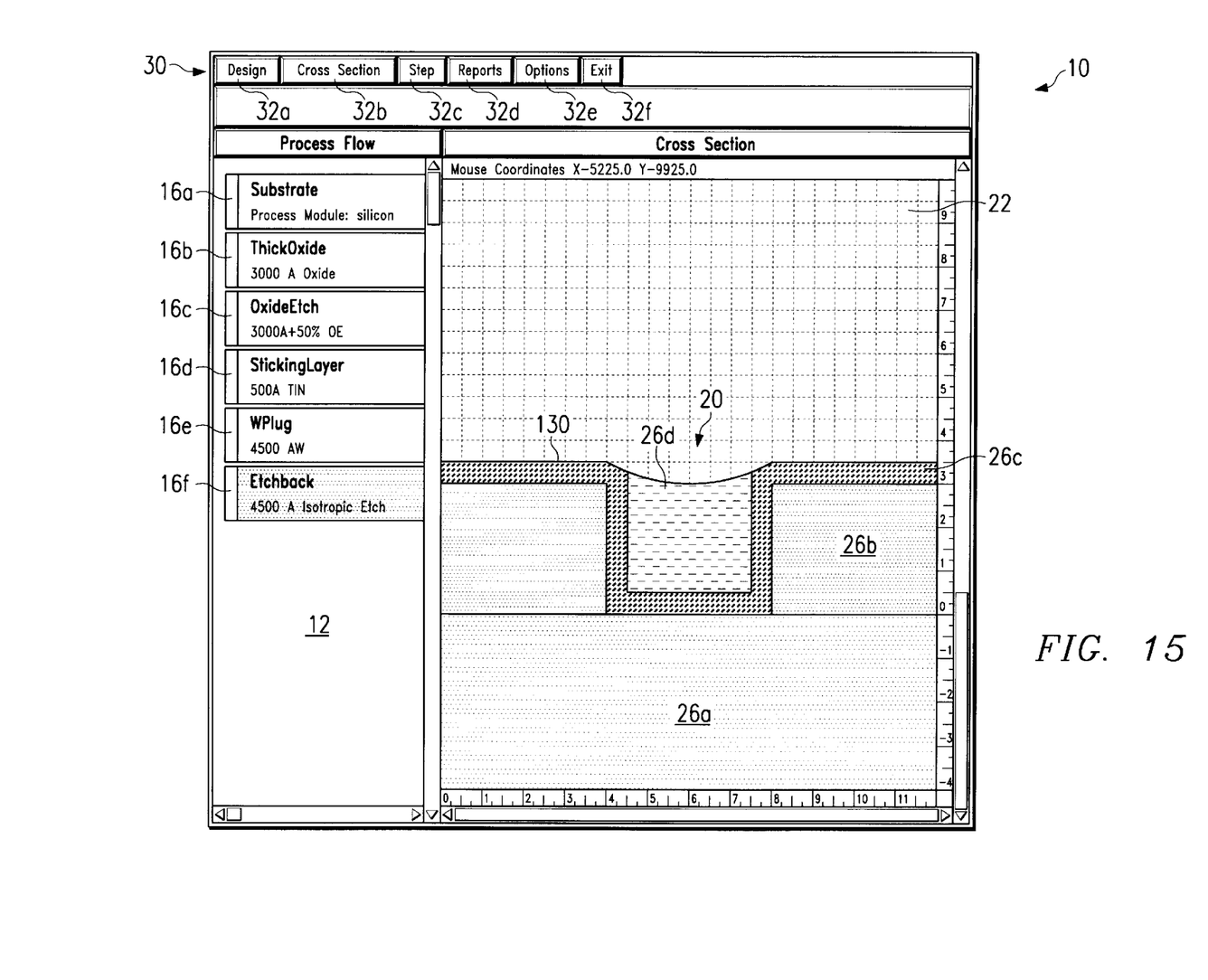
Figure 16:
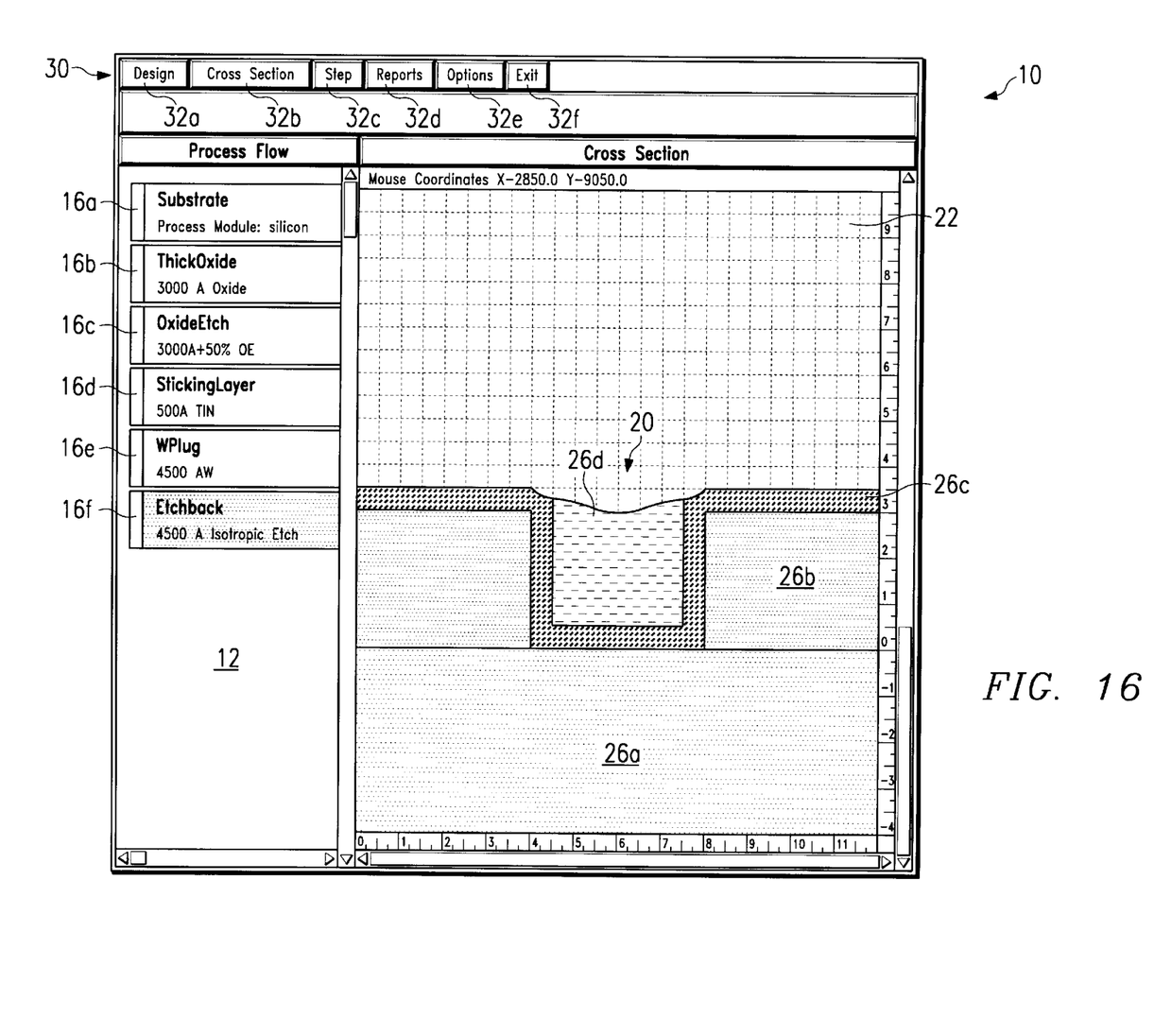

Because the profile of an actual device may differ from that shown in FIG. 14, the user may now wish to customize the profile. Customization is accomplished using a conventional mouse for a computer. Referring to FIG. 15, the right mouse button (not shown) is pressed in the area of material that was just etched away in the prior step. The surface 130 in Cross-section window 22 becomes highlighted. Points 132, which are indicated by small squares on surface 130, can be added, moved or deleted from the surface. The cursor us positioned over a point and the left mouse button is pushed down while the cursor/point is dragged to the desired location. The left mouse button is then released. The resulting Process Flow window 12 and Cross-section window 22 is shown in FIG. 16.

Because the embodiment of the invention uses a unified semiconductor process and wafer representation, the user may go back to any step in Process Flow Window 12. select that step and view the associated cross-section as processed through the selected step. For example, selecting the "Thick-Oxide" step will produce the cross-section window of FIG. 9, while still showing the Process Flow window 12 of FIG. 16. Any adding/editing/deleting occurring at one point in the process will cause the USPWR to update cross-sections associated with the current and subsequent process steps.

Following the process described above, text may be added to the Cross-section window 22 using "Cross-section/AddText" from main menu 30. The design can be saved in a file using "Design/Save" and printed using "Cross-section/Print" from the Main menu 30.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. For example, the present embodiment is implemented in the programming language of "C" and "Tk/Tcl" for a workstation platform. Other programming languages and platforms may alternatively be used. It is therefore intended that the appended claims encompass any such modifications or embodiments.

What is claimed is:

1. A method for visualizing a semiconductor design and process, comprising the steps of:
   providing a plurality of abstract process models having only a plurality of physical parameter inputs;
   providing a menu for adding, deleting, and editing a plurality of process steps using said plurality of abstract process models;
   displaying said plurality of process steps in a process flow window and allowing for the selection of one of said process steps; and
   displaying a cross-section of a wafer at said selected process step in a cross-section window.

2. The method of claim 1, wherein said plurality of abstract process models comprises one or more of the following: a conformal deposition module, planarizing deposition module, an anisotropic etch module, and an isotropic etch module.

3. The method of claim 1, wherein said plurality of physical parameter inputs comprise at least one parameter selected from the group consisting of: material type, thickness, sidewall ratio, etch selectivity, etch depth, misalignment, and mask openings.

4. The method of claim 1, wherein said cross-section window is associated with a graphical editor for customizing a cross-section profile.

5. The method of claim 1, wherein said cross-section window is associated with a text editor for adding text to said cross-section window.

6. The method of claim 1, further comprising the step of creating and updating, using a unified semiconductor process and wafer representation tool, said cross-section for said selected step using said process models prior to displaying said cross-section in said cross-section window.

7. The method of claim 1, wherein said plurality of process models comprises first order geometric models.

8. The method of claim 1, wherein said step of providing a menu comprises the step of:
   providing a list of said plurality of process models; and
   providing a dialog box for a each of said plurality of process models for receiving said plurality of physical parameters.

9. The method of claim 1, further comprising an editor for creating custom process models to be added to said set of process models.

10. A method for visualizing a semiconductor device structure and process, comprising the steps of:
    receiving a first process step input including only a first plurality of physical characteristics of a first device layer;
    creating a first semiconductor process and wafer representation (SPWR) for said first process step using said first plurality of physical characteristics;
    displaying said first semiconductor process and wafer representation;
    receiving a second process step input including only a second plurality of physical characteristics for a second device layer;
    creating a second SPWR for said first and second process steps;
    displaying said second SPWR;
    receiving instructions to alter said first device layer;
    automatically altering both said first and second SPWRs in response to said instructions; and
    redisplaying said first SPWR.

11. The method of claim 10, further comprising the steps of:
    receiving a third plurality of physical characteristics of a third device layer to be formed after said first device layer and prior to said second device layer;
    creating a third SPWR in response to said third plurality of physical characteristics;
    altering said second SPWR in response to the third plurality of physical characteristics; and
    displaying said third SPWR.

12. The method of claim 10, further comprising the steps of:
    receiving a third plurality of physical characteristics of a third device layer to be formed after said first device layer and said second device layer;
    creating a third SPWR in response to said third plurality of physical characteristics;
    displaying said third SPWR;
    receiving a display process step input; and
    displaying a selected one of said first, second or third SPWRs in response to said display process step input.

13. The method of claim 10, wherein said first plurality of physical characteristics are selected from the group consisting of: material type, thickness, sidewall ratio, misalignment, etch selectivity, etch depth, lateral etch ratio, number of mask openings, and the size of mask openings.

14. The method of claim 10, wherein said step of creating said first SPWR applies said first plurality of physical characteristics to a geometric process model.

15. The method of claim 14, wherein said geometric process model is selected from the group consisting of: a geometric conformal deposition model, a geometric planarizing deposition model, a geometric anisotropic etch model, a geometric isotropic etch model, a geometric reflow model, and a geometric chemical-mechanical polish model.

\* \* \* \* \*